United States Patent
Ammer et al.

(10) Patent No.: US 9,553,215 B2
(45) Date of Patent: Jan. 24, 2017

(54) METHOD AND DEVICE FOR RECOGNIZING FAULTS IN A PHOTOVOLTAIC SYSTEM

(75) Inventors: Michael Ammer, Wels (AT); Thomas Muehlberger, Marchtrenk (AT); Roland Proetsch, Roitham (AT); Yvonne Zwirchmayr, Wels (AT)

(73) Assignee: Fronius International GmbH, Pettenbach (AT)

( * ) Notice: Subject to any disclaimer, the term of this patent is extended or adjusted under 35 U.S.C. 154(b) by 350 days.

(21) Appl. No.: 13/500,651

(22) PCT Filed: Oct. 11, 2010

(86) PCT No.: PCT/AT2010/000382
§ 371 (c)(1),
(2), (4) Date: May 21, 2012

(87) PCT Pub. No.: WO2011/041819
PCT Pub. Date: Apr. 14, 2011

(65) Prior Publication Data
US 2012/0247542 A1    Oct. 4, 2012

(30) Foreign Application Priority Data
Oct. 9, 2009   (AT) ................................. A 1600/2009

(51) Int. Cl.
*G01R 31/26*    (2014.01)
*H01L 31/02*    (2006.01)
*H02S 50/10*    (2014.01)

(52) U.S. Cl.
CPC ......... *H01L 31/02021* (2013.01); *H02S 50/10* (2014.12); *Y02E 10/50* (2013.01)

(58) Field of Classification Search
CPC ........ G01R 31/405; H02J 3/383; H02S 30/00; F21V 9/02
(Continued)

(56) References Cited

U.S. PATENT DOCUMENTS

| 4,755,942 A | 7/1988 | Gardner et al. |
|---|---|---|
| 2002/0059035 A1* | 5/2002 | Yagi et al. ...................... 702/59 |

(Continued)

FOREIGN PATENT DOCUMENTS

| CN | 1768273 A | 5/2006 |
|---|---|---|
| CN | 101227090 A | 7/2008 |

(Continued)

OTHER PUBLICATIONS

Stellbogen, D., "Use of PV Circuit Simulation for Fault Detection in PV Array Fields," 1993 IEEE, pp. 1302-1307.
International Search Report of PCT/AT2010/000382, May 24, 2011.

*Primary Examiner* — Daniel Miller
(74) *Attorney, Agent, or Firm* — Collard & Roe, P.C.

(57) ABSTRACT

The invention relates to a method and a device for recognizing faults in a photovoltaic system (1). A first output voltage (U0, UMPP) of the system (1) and/or a first parameter derived from the output voltage (U0, UMPP) is determined at a first point in time in a first operating state of the photovoltaic system (1). At a second point in time in a second operating state comparable to the first operating state, a second output voltage (U0, UMPP) and/or a second parameter of the system (1) derived from the output voltage (U0, UMPP) is determined. Finally, a deviation between the first and the second output voltage (U0, UMPP) and/or between the first and the second parameter is identified and a fault notification is output if the deviation exceeds a predeterminable threshold.

20 Claims, 4 Drawing Sheets

Figure 1:
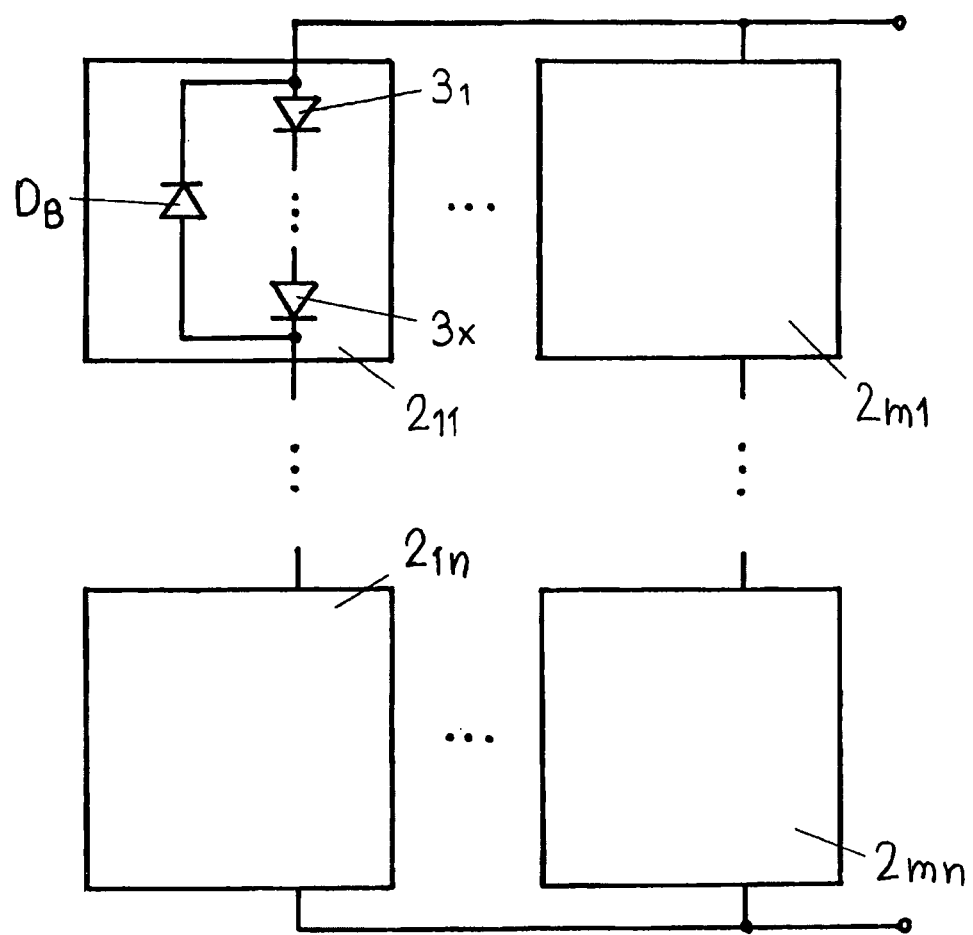

(58) Field of Classification Search
USPC .................................................. 324/761.01
See application file for complete search history.

(56) References Cited

U.S. PATENT DOCUMENTS

| | | |
|---|---|---|
| 2006/0085167 A1 | 4/2006 | Warfield et al. |
| 2008/0272279 A1 | 11/2008 | Thompson |
| 2009/0000659 A1 | 1/2009 | Hasegawa et al. |
| 2009/0020110 A1* | 1/2009 | Lauritzen .................. 126/590 |
| 2010/0138063 A1* | 6/2010 | Cardinal et al. ............ 700/291 |

FOREIGN PATENT DOCUMENTS

| | | |
|---|---|---|
| CN | 101375408 A | 2/2009 |
| DE | 201 02 619 | 5/2001 |
| EP | 1 170 596 | 1/2002 |
| EP | 1 223 431 | 7/2002 |
| EP | 2 019 433 | 1/2009 |
| JP | 2005-340464 | 12/2005 |
| WO | WO 2004/090559 | 10/2004 |

* cited by examiner

METHOD AND DEVICE FOR RECOGNIZING FAULTS IN A PHOTOVOLTAIC SYSTEM

CROSS REFERENCE TO RELATED APPLICATIONS

This application is the National Stage of PCT/AT2010/000382 filed on Oct. 11, 2010 which claims priority under 35 U.S.C. §119 of Austrian Application No. A 1600/2009 filed on Oct. 9, 2009, the disclosure of which is incorporated by reference. The international application under PCT article 21(2) was not published in English.

The invention relates to a method and a device for recognizing faults in a photovoltaic system.

Photovoltaic systems or solar systems (also referred to as "solar power stations" above a certain size) are now indispensable to the current production of energy, both for supplying public networks or for stand-alone operations, such as for buildings which can only be supplied with power from the public network with difficulty or at considerable expense.

Photovoltaic systems convert the electromagnetic spectrum of the sun into semi-conducting layers (namely in solar or photocells) by means of the photon bombardment of radiation directly into electric current. Mostly, a plurality of solar cells are combined into solar modules and the latter in turn are combined into a solar system or a solar power station.

During the operation of a photovoltaic system losses in production may occur for various reasons. A distinction can be made in principle between effects which influence the current of the photovoltaic system and effects which influence the voltage of the photovoltaic system. Examples of current-reducing influences are the ageing of the solar cells and the yellowing thereof. The latter are mostly module-specific and cannot be influenced de facto by the operator of a system. Examples of voltage-reducing influences, in addition to ageing which is hard to prevent, include high-impedance or even open soldering points, welding points, clamping connections etc., shaded, dirty or even broken solar cells or solar modules as well as defect bypass-diodes and hot-spots associated with shading. Apart from ageing these types of damage are specific to the system and can be overcome by replacing defective parts or cleaning dirty parts.

It is also the case that in a functioning photovoltaic system, from a technical point of view, losses of output have to be accepted, for example if vegetation, in particular trees, cast a shadow on the solar system over time. The system may also become overshadowed if high buildings are erected in front of the solar system. In principle these "faults" can also be overcome by pruning or felling trees or by possibly moving the system when a new building is erected.

Although voltage-reducing influences can generally be avoided, as already mentioned, the reliable recognition of a drop in output is problematic, as the output produced by a solar system fluctuates considerably owing to the varying radiation of the sun and this is not a suitable indicator of a defective solar system at all times. In practice it has been shown that losses in output are only recognized after several years if at all, which is disadvantageous with regard to the high construction costs of a photovoltaic system and also aggravating—as they can be prevented in principle.

US 2002/0059035 A1 discloses on this subject a system, in which a reference value of a photovoltaic system is determined in a normal operating state. In running operation current values of this reference parameter are determined and compared with the said reference value, in order to determine whether the photovoltaic system is operating correctly or not.

EP 2 019 433 A1 also discloses a system for determining the properties of a solar cell, comprising a measuring unit for measuring a current-voltage path of the said solar cells, a conversion unit for converting the measurement value into a reference condition and a memory for storing a plurality of such reference conditions. Lastly, the system comprises a comparison unit for determining which of the saved reference conditions is closest to a currently determined current voltage path.

The objective of the invention is therefore to provide a method and a device for recognizing faults in a photovoltaic system, in particular in existing photovoltaic systems, which are not to be or cannot be modified.

The objective of the invention is achieved by means of a method for recognizing faults in a photovoltaic system, comprising the steps:

determining a first output voltage of the system and/or a first parameter derived from said output voltage at a first time point in a first operating state of the photovoltaic system, determining a second output voltage and/or a second parameter of the system derived from said output voltage at a second time point in a second operating state comparable with the first operating state, determining a deviation between a first and second output voltage and/or between a first and second parameter and outputting an error message, if the deviation exceeds a predeterminable threshold.

The objective of the invention is also achieved by means of a device for recognizing faults in a photovoltaic system, comprising:

means for determining a first output voltage of the system and/or a first parameter derived from this output voltage at a first time point in a first operating state of the photovoltaic system, means for determining a second output voltage and/or a second parameter of the system derived from said output voltage at a second time point in a second operating state comparable with the first operating state, means for determining a deviation between a first and second output voltage and/or between the first and second parameter and means for outputting an error message, if the deviation exceeds a predeterminable threshold.

The particular advantage of this invention is that simply by way of the output voltage of a photovoltaic system it is possible to determine its operating efficiency. This means that in the photovoltaic system itself no particular precautions need to be taken and even existing systems can be monitored easily by using the method according to the invention. The device according to the invention can for example be in the form of a measuring device, a monitoring circuit or also in the form of a "data logger" (a data logger is a measuring device, which can determine physical measurement data over a specified period and store it in a memory).

"Determining" refers within the scope of the invention both to the active measurement of voltage and to receiving a measurement value from a (connected) measuring device. Thus a measuring device and a data logging device can be integrated into one device, or the functions are distributed to different places. The method according to the invention is then carried out essentially at the time of measurement, i.e. "online". Furthermore, "determining" includes both the receiving and reading of a saved measurement value out of or from a database. For example, measurement values can be saved for a specific period in a database or in a memory and the method according to the invention can be applied in retrospect, i.e. "offline", to the data. "Determining" thus also means the active measurement of voltage or receiving a measurement value with subsequent storage of the measurement value in a memory or database.

"Deviation" in terms of the invention means both the difference and also a quotient between two values, or also any other operation from which the difference between two values becomes clear. In particular, thus also logical operators, for example a less than or more than operator are suitable for establishing a deviation between two values.

Advantageous embodiments and developments of the invention are described in the subclaims and in the description in combination with the Figures of the drawing.

It is an advantage if the maximum power point voltage and/or the open circuit voltage of the photovoltaic system are provided as the output voltage. The advantage of determining the maximum power point voltage is that a photovoltaic system is usually operated in a known manner at this operating point, for example by means of a suitable control in an inverter connected to the photovoltaic system. The maximum power point voltage can therefore practically be dropped at any time at the output clamps of the photovoltaic system or at the input clamps of a connected inverter. Alternatively to this or in addition the open circuit voltage can also be determined. For example, the photovoltaic system can be separated briefly (e.g. for several tenths of seconds) from the connected consumer units.

It is also an advantage if the parameter is the ratio between the maximum power point voltage and the open circuit voltage of the photovoltaic system. Both the voltage at the maximum power point and also the open circuit voltage are dependent on the temperature and intensity of the light. By forming a quotient, the influence of the said factors can be reduced. Thus a relatively clear message is given, as to whether a change in the said parameter is caused by a defect in the photovoltaic system or not.

It is also advantageous if an output voltage and/or a derived parameter are determined at radiation of more than 100 W/m$^2$. Both the maximum power point voltage and also the open circuit voltage are dependent from a certain level of radiation to a lesser extent on the latter. In other words the maximum power point voltage and open circuit voltage remain essentially constant from a specific radiation output. Of course, the same also applies to the ratio between the maximum power point voltage and the open circuit voltage. Measurements above this threshold are thus taken in similar operating conditions of the photovoltaic system. This threshold is about 100 W/m$^2$. In a further advantageous embodiment this threshold is set to 200 W/m$^2$ and in a particularly advantageous embodiment it is set to 500 W/m$^2$, as the aforementioned (differential) dependency of the voltages on the radiation output is then even lower. If one of the voltages changes or the ratio between the two changes, without the radiation output falling below the set threshold, it can be assumed that the change in voltage has been caused by a defect in the photovoltaic system.

It is also advantageous if an output voltage and/or a derived parameter are determined at an output of the photovoltaic system or an inverter connected thereto which is greater than 15% of the respective nominal output. From this output it can be assumed that the radiation corresponds to at least 100 W/m$^2$.

It is therefore particularly advantageous if an output voltage and/or a derived parameter are determined at essentially the same radiation or the same output. In this case the tolerance band for the radiation, at which the voltages are determined, is defined even more narrowly. The maximum power point voltage and the open circuit voltage therefore move within even narrower tolerance limits—provided that there is no defect in the photovoltaic system.

It is therefore particularly advantageous if the radiation is determined by means of a light-sensitive sensor. The output signal is therefore directly a measure of the radiated power. Advantageously, output voltages of the photovoltaic system or parameters derived therefrom are determined at essentially the same output signal of the light-sensitive sensor and thereby at comparable or even the same operating conditions of the photovoltaic system. In a particularly advantageous variant the output of the photovoltaic system is compared with the radiation.

At this point it is reiterated that the advantage of the invention is that such a sensor is not absolutely necessary and instead with simple means—namely a voltage measurement—very good reports can be made about the state of the system. The installation of such a sensor is therefore also unnecessary.

It is also advantageous if an output voltage and/or a derived parameter are determined essentially at the same temperature. The voltages generally vary significantly with temperature. As the voltages (e.g. open circuit voltage and MPP-voltage) are measured essentially at the same temperature or similar temperatures and both voltages behave the same with temperature by means of this effect the formation of quotients can be avoided. The permissible temperature range, in which voltage measurement is performed, thus determines mainly the required amount to which the temperature influence should be suppressed.

In a further advantageous variant of the invention to determine the operating status of the photovoltaic system data from a weather station and/or meteorological data from a database can be used optionally. For example, the device according to the invention can be connected to a weather station that can measure sun radiation. The latter could be a private weather station on a domestic scale or a public weather station. In particular, there could be a data connection via radio. Lastly, it is also possible to download suitable data, in particular meteorological data from a meteorological institute via the internet and use it for the method according to the invention. By means of this data it can also be established in retrospect and thereby "offline", what the weather conditions were or how cloudy it was at a specific time and thus it is also possible to establish the prevailing operating status in a photovoltaic system.

It is also an advantage if the output voltage and/or a derived parameter are determined on different days at essentially the same time. It can be assumed that the radiation output changes at a specific time on different days—depending on the cloudiness and the season—within specific tolerance limits. Also above a specific threshold the maximum power point voltage and the open circuit voltage as already mentioned change only slightly with radiation output. Therefore, two voltage values determined on different days but at the same time (e.g. midday) can be compared as a rule, i.e. the photovoltaic system in comparable operating states. For a photovoltaic system in the Sahara for example this would make sense but in central Europe the radiation output at midday—even on a cloudy summer day—is generally above 100 W/m². Furthermore, a correctly planned and installed photovoltaic system should not be shaded at midday. If the maximum power point voltage and the open circuit voltage between two measurements changes substantially, it may be assumed that there is a defect in the photovoltaic system.

It is also advantageous if the output voltage and/or a derived parameter are determined on different days essentially with the same level of sun. The above comments about the time apply here too, but in this case differences between summer and winter time or movements over time zones have no impact (for example the method according to the invention can also be applied in mobile solar systems, such as caravans).

In a further advantageous variant of the invention the output voltage and/or a derived parameter is determined at essentially the same output power of the photovoltaic system. Also the output power can be used advantageously to determine a specific operating state. In fact a defect in the photovoltaic system, for example the failure of a solar module, means that the same output power is achieved only with greater radiation, but the maximum power point voltage and the open circuit voltage change only little above a threshold, as already mentioned. At the same output power therefore generally the operating states of the photovoltaic system are comparable.

At this point it should be noted that the variants of the method according to the invention and the resulting advantages also relate equally to the device according to the invention.

In particular it is an advantage if the device according to the invention comprises an inverter for a photovoltaic system with DC voltage side and AC voltage side connections, wherein the device according to the invention is connected to the DC voltage side connections. Solar systems connected to AC grid, either a public grid or a stand-alone network, always comprise an inverter. As the latter is connected to the output clamps of the photovoltaic system, a device according to the invention installed into the inverter can easily pick up and evaluate the output voltage of the photovoltaic system. In an advantageous manner such an inverter, which detects a fault in the photovoltaic system, can also be connected to existing systems without the latter having to be modified for this.

It is also advantageous if the device according to the invention comprises a charging controller for a photovoltaic system, wherein the device according to the invention is connected to input side connections of the charging controller. The information relating to the inverter applies here by analogy, only that the photovoltaic system here supplies a DC voltage grid. As a rule electrical energy is stored temporarily in an accumulator, which is why a charging controller is necessary. However, even without a support battery a voltage stabilizing circuit is generally provided between the photovoltaic system and supplied grid. Within the scope of the invention a charging controller can also be defined as a voltage stabilizing circuit, which is not connected to an accumulator.

Therefore, it is also advantageous if a photovoltaic system with one or more solar cells and/or one or more solar modules, comprises an inverter according to the invention and/or a charging controller according to the invention.

However, it is also advantageous if the invention is in the form of a computer program product with a computer program saved thereon, which can be loaded into the memory of a device according to the invention and/or an inverter according to the invention and/or a charging controller according to the invention and/or a computer and executes the method according to the invention when the computer program is implemented. In this way for example also existing inverters can be equipped with the method according to the invention in that for example a corresponding firmware is modified. The method according to the invention can also be implemented offline on standard PCs.

Furthermore, the objective of the invention is also achieved in that an initialization process is performed for determining the starting operation of the system after installation, and in that to determine measurement values for determining module damage firstly a weather analysis is performed (determined by output data of the inverter), wherein in the case of a positive weather analysis additional measurement values are recorded, whereas with a negative weather analysis at a later time point a further weather analysis is carried out.

It is an advantage in this case that immediately after the startup of the system when it should be assumed the function is optimal, measurement values or reference values are determined which can be used for later comparisons. By recording and saving such values in a simple form a change in the running operation of the system can be detected. A further essential advantage is that during the running operation not all of the measurement values are picked up, as the latter can differ from one another considerably owing to very different weather conditions, which means that evaluation is difficult. To avoid this and to pick up only values or data in similar weather conditions, a weather analysis is performed first by the inverter prior to determining the measurement values or data.

Measures are also an advantage in which to recognize module damage a continuous detection of the Udc-voltage is performed, whereby by changing the ratio of the MPP voltage to the open circuit voltage of the module creeping and/or sudden module damage is identified, as in this way in a simple manner and without additional sensors and external components faulty modules can be recognized.

Furthermore, a method is also advantageous in which the initialization process at preset time points (e.g. at about midday) or a defined, set time point, or a manually triggered measuring process for determining and picking up the operating state of the system is started, as in this way it is ensured that the first measurement values can be detected only with optimal sun radiation by means of which over time a change in the system can be recognized.

In a method in which the following module damage is identified: high-impedance soldering points within the module, open soldering point on a cell, hotspots, shadowing, dirt, cell damage, high-impedance soldering point in the connection socket, etc., and output via a display element, it is an advantage that the user is informed about the various different faults and can takes steps to ensure the optimal operation of the system.

The following measures are also advantageous in which the weather analysis is performed at a predetermined time point (e.g. midday), in which the supplied amount of energy or the inverter output is recognized and compared with a predetermined value, in which preferably the latter corresponds to a preadjustable percentage, for example 50% of the maximum, in order to achieve a positive weather analysis, as in this way in a simple manner without additional measuring means only internal measurements can be used to come to conclusions about the weather situation, whereby it is ensured that measurement values are determined under almost the same conditions which are meaningful to the other already determined measurement values.

Lastly, a measure is advantageous in which by means of a control device arranged in the inverter or an externally connected control device an evaluation is performed for recognizing module damage, as in this way different structures of the system can be implemented.

The above embodiments and developments of the invention can be combined in any manner.

For a better understanding of the invention the latter is explained in more detail with reference to the following Figures.

Figure 2:
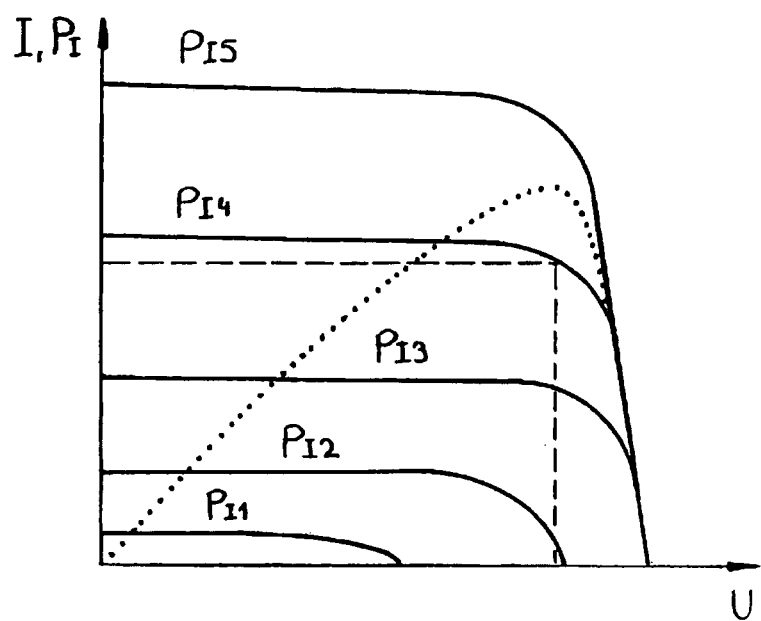
Figure 3:
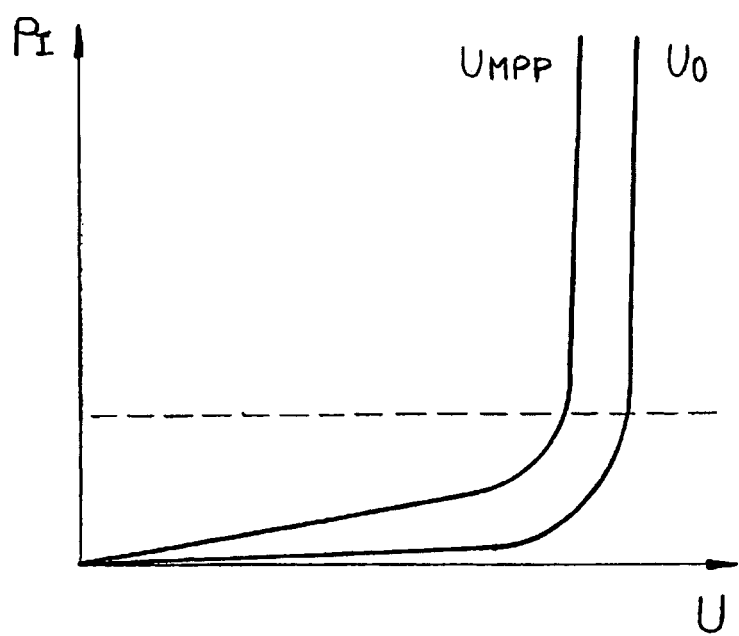
Figure 4:
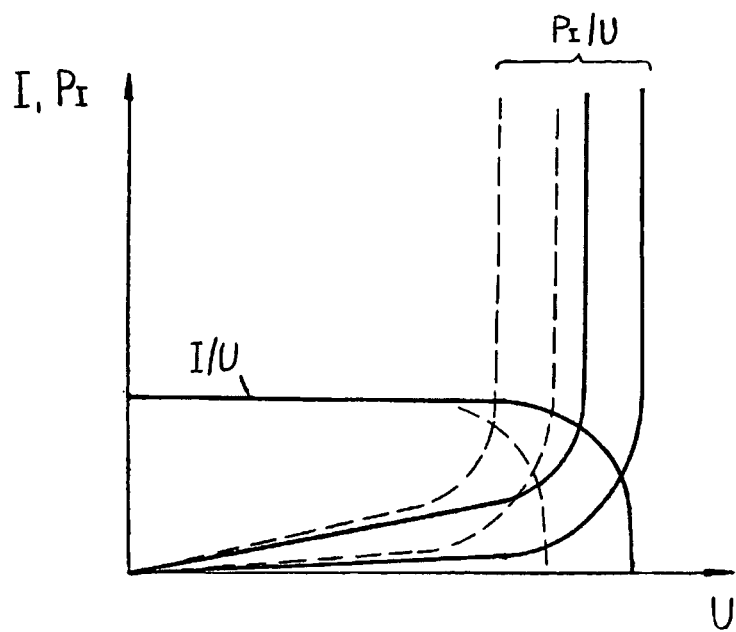
Figure 5:
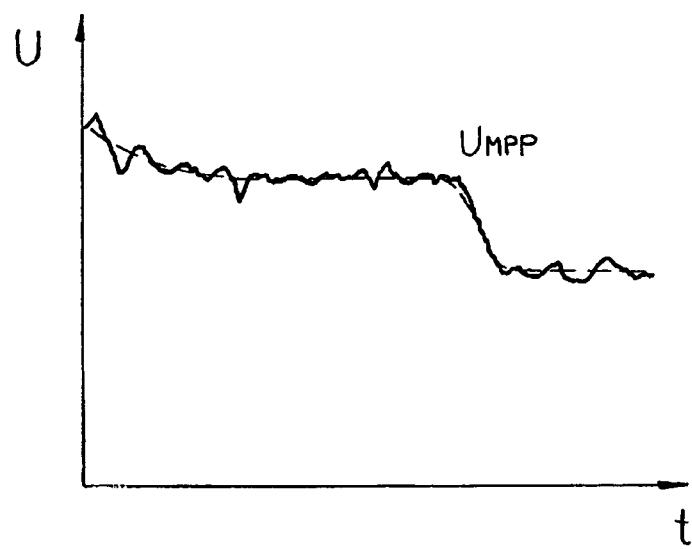
Figure 6:
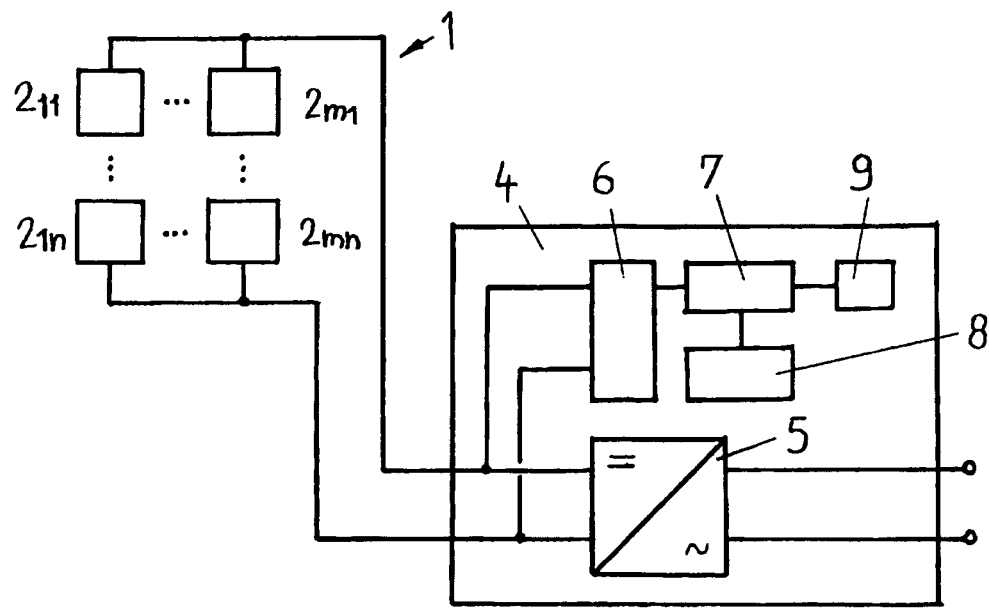
Figure 7:
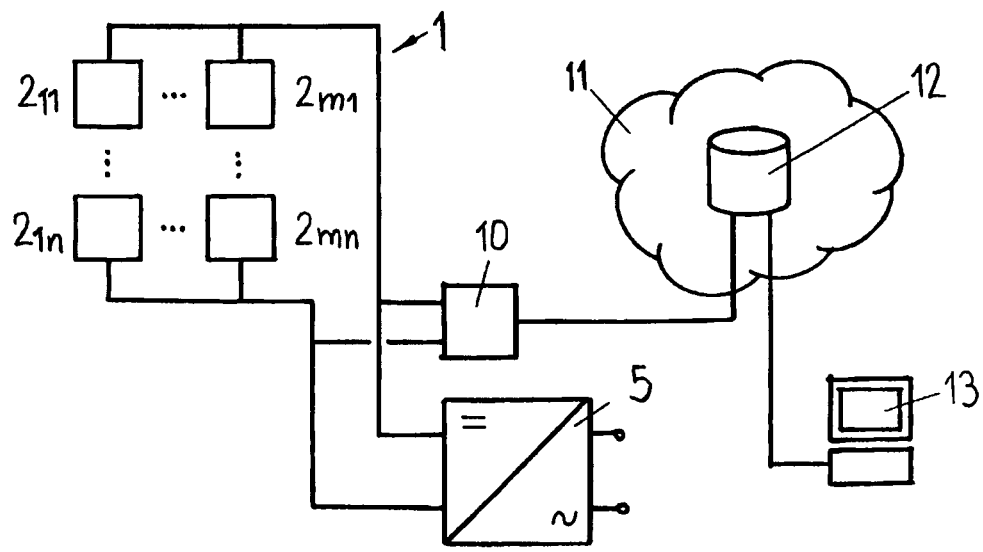

In a schematically much simplified representation the Figures show:

FIG. 1 a schematic photovoltaic system;

FIG. 2 a current-voltage diagram and a power-voltage diagram of a solar module;

FIG. 3 a path of the open circuit voltage and the voltage at maximum power point as a function of the radiation output;

FIG. 4 the effects of a breakdown of a solar module or a solar cell;

FIG. 5 the time path of the voltage at the maximum power point;

FIG. 6 a schematic view of a photovoltaic-system with an inverter according to the invention;

FIG. 7 a schematic view of a photovoltaic system with a device according to the invention in the form of a measuring device.

First of all, it should be noted that in the variously described exemplary embodiments the same parts have been given the same reference numerals and the same component names, whereby the disclosures contained throughout the entire description can be applied to the same parts with the same reference numerals and same component names. Also details relating to position used in the description, such as e.g. top, bottom, side etc. relate to the currently described and represented figure and in case of a change in position should be adjusted to the new position. Furthermore, also individual features or combinations of features from the various exemplary embodiments shown and described can represent in themselves independent or inventive solutions.

The exemplary embodiments show possible embodiment variants of a device according to the invention, whereby it should be noted at this point that the invention is not restricted to the embodiment variants shown in particular, but rather various different combinations of the individual embodiment variants are also possible and this variability, due to the teaching on technical procedure, lies within the ability of a person skilled in the art in this technical field. Thus all conceivable embodiment variants, which are made possible by combining individual details of the embodiment variant shown and described, are also covered by the scope of protection.

FIG. 1 shows schematically a photovoltaic system 1 consisting of a plurality of identically designed solar modules $2_{11} \ldots 2_{mn}$. A plurality of solar modules $2_{11} \ldots 2_{mn}$ connected in series (and arranged here vertically below one another) form a string respectively. A plurality of strings connected in parallel (and arranged here horizontally next to one another) form the photovoltaic system 1. Of course, the local distribution of the solar modules $2_{11} \ldots 2_{mn}$ can also be different in a real system.

A solar module $2_{11} \ldots 2_{mn}$ consists of a plurality of solar cells $3_1 \ldots 3_x$ connected in series. In the shown example one solar module $2_{11} \ldots 2_{mn}$ consists only of a string of solar cells $3_1 \ldots 3_x$ connected in series. However, it is also possible for one solar module $2_{11} \ldots 2_{mn}$ to consist of a plurality of parallel connected solar cells $3_1 \ldots 3_x$ or strings. Lastly, one solar module $2_{11} \ldots 2_{mn}$ also comprises a bypass diode (also a free-wheeling diode) $D_B$, here anti-parallel to all solar cells $3_1 \ldots 3_x$. It is also possible—although not usual—that each solar cell $3_1 \ldots 3_x$ comprises its own bypass diode $D_B$ or one bypass diode $D_B$ is provided for several solar modules $2_{11} \ldots 2_{mn}$. The bypass diode $D_B$ has in a known manner the purpose of maintaining the current flow and thereby the current generation of a string even when a solar module fails, for example because it is broken or it is in the shade. In this case the voltage generated by the other modules in the string means that the defect or shaded module is operated in reverse direction. Thus without the bypass diode $D_B$ the entire string would fail.

In the following observations solar cells $3_1 \ldots 3_x$ and solar modules $2_{11} \ldots 2_{mn}$ are considered to be equivalent. Although in the following reference is made to solar modules $2_{11} \ldots 2_{mn}$, the same also applies equally to solar cells $3_1 \ldots 3_x$. Both are considered within the scope of the invention as elements which generate voltage and current with radiation.

FIG. 2 shows a current-voltage diagram and a power voltage diagram of a solar module $2_{11} \ldots 2_{mn}$. Here characteristic curves are represented with varying light radiation distinguished by the radiation power $P_{11} \ldots P_{15}$. It is shown clearly that with increasing light radiation both the short circuit current (i.e. the output current I at output voltage U=0) and the open circuit voltage (i.e. the output voltage U at initial current I=0) increase. From a certain level of light radiation (here in the curve for $P_{13}$) only the short circuit current I rises noticeably, the open circuit voltage however remains more or less constant.

Furthermore, for $P_{14}$ the so-called "maximum power point", (also referred to as the "MPP-point"), i.e. the operating point with the greatest output power of the solar module $2_{11} \ldots 2_{mn}$, is entered. The associated voltage and the associated current are represented by dashed lines.

The voltage at the maximum power point is denoted in this case by $U_{MPP}$. The dotted line shows generally the path of the output power of the solar module $2_{11} \ldots 2_{mn}$.

FIG. 3 shows the path of the open circuit voltage $U_0$ as well as the voltage at maximum power point $U_{MPP}$ as a function of the radiation output $P_1$. It can be seen clearly that both the open circuit voltage $U_0$ and the voltage $U_{MPP}$ remain constant from a certain radiation output P (here marked by a dashed line). In reality this value is at a radiation output of about 100 W/m².

FIG. 4 shows what happens if a solar module $2_{11} \ldots 2_{mn}$ (or a solar cell $3_1 \ldots 3_x$) no longer supplies electrical power for any reason. The solid lines show the characteristic curves already known from FIGS. 2 and 3 with the correct functioning of the solar module $2_{11} \ldots 2_{mn}$. If one solar module $2_{11} \ldots 2_{mn}$ fails, the current flows through the assigned bypass diode $D_B$. Since the voltage dropping at the bypass diode $D_B$ is much lower than the voltage produced by a solar module $2_{11} \ldots 2_{mn}$ this is associated with a drastic drop of voltage $U_{MPP}$. The characteristic curves on the failure of a solar module $2_{11} \ldots 2_{mn}$ are shown by dashed lines in FIG. 4. The current/voltage characteristic lines are denoted by I/U, the power/voltage characteristic lines by $P_1/U$. With an increasing number of branches connected in parallel in a photovoltaic system 1 the effect is naturally smaller. In a usual real photovoltaic system 1 the effect is therefore generally much less than is shown in FIG. 4.

According to the invention the output voltages of the photovoltaic system 1 and/or parameters derived from this output voltage are determined at different time points but in comparable operating conditions of the photovoltaic system 1. If there is a deviation between the output voltages or the derived parameters an error message is emitted. This can be performed for example optically or acoustically. For example, a message to a mobile phone is also possible. The voltages that are determined are for example the maximum power point voltage $U_{MMP}$ and/or the open circuit voltage $U_0$ of the photovoltaic system 1. Also the ratio of the two is suitable for an evaluation. Although in the following observations the maximum power point voltage $U_{MPP}$ is mentioned, the explanations relate equally to the open circuit voltage $U_0$ and the ratio between the voltage $U_{MMP}$ and the open circuit voltage $U_0$.

FIG. 5 now shows the time path of the voltage $U_{MMP}$ (continuous line) and their average value (indicated by a dashed line) of a photovoltaic system 1. It can be seen clearly that the voltage $U_{MPP}$ drops relatively quickly to a stable level after the first startup of the photovoltaic system 1, generally within the first 3 to 6 months. This is associated with ageing or a stabilization phase of a solar module $2_{11} \ldots 2_{mn}$ which have a relatively significant effect at the beginning of operation. Afterwards the voltage $U_{MPP}$ only drops slightly. The voltage $U_{MMP}$ oscillates to a greater or lesser extent about an average value, mainly because different temperatures have a comparatively strong influence on the said voltage $U_{MMP}$. With an increasing temperature the voltage $U_{MMP}$ drops, whereas it increases with falling temperature (as already mentioned the open circuit voltage $U_0$ is subject to the same effect, which is eliminated on the formation of the quotient between $U_{MMP}$ and $U_0$). In the shown diagram at a specific time point a massive and relatively sudden drop in the voltage $U_{MPP}$ is established. According to the invention an error message is sent, as it is assumed that a fault has occurred in the photovoltaic system 1. The error can have different causes:

- in the photovoltaic system 1 (solar cell $3_1 \ldots 3_x$, solar module $2_{11} \ldots 2_{mn}$, connection box) there is a high-impedance or even an open soldering point, welding point, clamping connection, etc.
- a solar cell $3_1 \ldots 3_x$ or a solar module $2_{11} \ldots 2_{mn}$ is in the shade or dirty
- a solar cell $3_1 \ldots 3_x$ or a solar module $2_{11} \ldots 2_{mn}$ is broken.

Although shadowing or dirt are not actual defects they do lead to a reduction in output and are therefore still considered as faults in the photovoltaic system 1 in terms of the invention. For example, a tree may have grown in the vicinity of a photovoltaic system 1 over the years so that the latter is now in the shade. The operator of the photovoltaic system 1 can take appropriate steps in response to the error message.

It should be noted at this point that the stabilizing phase shown in FIG. 5 does not occur in all types of solar cells, but as a rule only in certain thin layer cells. Unlike the representation in FIG. 5 the drop in voltage at the beginning of the operation of a photovoltaic system 1 may not occur. This means the voltage is more or less constant up to the occurrence of a fault.

The voltage $U_{MPP}$ in FIG. 5 was determined on different days but at the same time of day. The voltage $U_{MPP}$ therefore fluctuates a relatively small amount from its average value. Of course, also measurement values can be determined during a specific time period on the day. Lastly, it is also possible to record the values over 24 h (this may be practical in polar regions for example). As a rule the voltage $U_{MPP}$ then fluctuates more strongly from an average value. Depending on the width of the fluctuation the values obtained should therefore be subjected to greater or lesser low pass filtering, sliding average value formation or the like, so that individual rogue measurements do not trigger a false alarm. It can also be observed whether the drop in voltage $U_{MPP}$ continues over a longer period, e.g. several days, and an error message is only sent then. Lastly, how long it needs to be waited before an error message is sent is relative to the tolerable loss of output. Lastly, it is also possible, in addition or alternatively to evaluate the rate of change of the voltage $U_{MPP}$ and for example to emit an error message if the rate of change exceeds a specific threshold.

As an alternative to determining the voltage $U_{MPP}$ at the same time of day it can also be carried out at the same position of the sun. The above then applies by analogy.

In a further alternative embodiment a measurement of the voltage $U_{MPP}$ is always activated at a specific level of radiation. For example, a timing element or timer can be AND connected to a light-sensitive sensor, so that for example every 15 minutes a measurement is recorded, provided that the radiation lies within a specific tolerance range. In addition, data can be evaluated from associated weather stations. The use of additional sensors and/or data from weather stations is however not obligatory for the invention.

In a further alternative embodiment the output of the photovoltaic system 1 is used for triggering the determination of the measurement value. For example a timing element or timer can be AND connected to an output measuring device, so that for example every 15 minutes a measurement value is recorded, provided that the output power of the photovoltaic system 1 lies within a specific tolerance range. The value for the output power can originate from an inverter or charging controller connected to the photovoltaic system 1. It is particularly advantageous if the method according to the invention is performed directly in the inverter or charging controller.

In the previous examples it was assumed that the measurement values are evaluated more or less at same time that they are determined, i.e. "online". This is not absolutely necessary. An evaluation can also be performed "offline".

In a first example, measurement data as described above are determined and saved on a storage medium. For example a USB stick can be connected to a device according to the invention, an inverter according to the invention or a charging controller according to the invention. The data are then evaluated as described above on a PC with software which implements the method according to the invention.

In an alternative embodiment the measurement data are transmitted for example by radio or the internet into an associated database, saved there and evaluated. For example, the producer of an inverter or charging controller according to the invention can ensure that from the latter the data are sent periodically to a specific database. In this way all photovoltaic systems 1, which are equipped with the inverters or charging controllers of the said producer, are monitored centrally. For example, an error message can prompt the manufacturer to offer the operator of the photovoltaic system 1 the services of a technician for checking the system, for example by phone or e-mail. The customer service can thus be designed to be particularly effective.

In a further embodiment it is assumed that data on the voltage $U_{MMP}$ or the open circuit voltage $U_0$ is available, but that the latter were not determined in comparable operating conditions of the photovoltaic system 1. To make the data usable for the method according to the invention said data are linked with historical data from a weather station or data from a meteorological institute. In this way values can be filtered out of the data of the photovoltaic system 1 which are relevant for the method according to the invention. In this way also historic values of a photovoltaic system 1, i.e. values which were taken prior to the present invention can also be made use of. Faulty photovoltaic systems 1 can thus also be detected in retrospect. The scope of the application of the invention is significantly increased by this method.

With the use of external sensors it can also be advantageous to use the system power instead of the voltage, because it can generally be determined more easily and also more precisely.

Lastly, FIG. 6 shows schematically a photovoltaic system 1, comprising a plurality of solar modules $2_{11} \ldots 2_{mn}$, with an inverter 4 connected thereto. The inverter 4 comprises in this example an inverter circuit 5, a device according to the invention in the form of an analog-digital-converter 6 for detecting an output voltage of the photovoltaic system 1, a central computer unit 7 with connected memory 8 and a signal unit 9. In the memory 8 are the program steps and parameters necessary for performing the method according to the invention, which are read and executed or processed during the operation by the central computing unit 7. The memory 8 is also provided for saving measurement values. In the computer unit 7 it is checked whether two voltage values or two parameters derived therefrom differ from one another. If this is the case an error message is output via the signal unit 9. The signal unit 9 can consist of a signal lamp, a siren, a text display unit of the inverter 4, a radio transmitter or even a connection to the internet. Although the method according to the invention in this example is represented in software, of course a hardware representation is also possible, for example in the form of a corresponding integrated circuit.

Lastly, FIG. 7 shows an arrangement in which the method according to the invention is performed "offline". In this case the photovoltaic system 1 comprises an inverter circuit 5 connected thereto and a device according to the invention in the form of a measuring device 10 with an integrated data interface. By means of said data interface data are transmitted by cable or wireless connection to a database 12 located in the internet 11. By means of a PC 13 a person responsible for monitoring several photovoltaic systems 1 has access to this data and evaluates it with a program running on his PC 13, which performs the method according to the invention. In an alternative embodiment the method according to the invention is performed automatically at set times points on the PC 13, so that the intervention of an operator is only necessary when a defective photovoltaic system 1 is reported. In a further alternative embodiment the said program is executed directly in the database 10, which sends an error message to a previously determined e-mail address.

In the following the detailed sequence of the method for recognizing module damage is described, which can be applied to the FIGS. 1 to 7 described above or the embodiments.

During the installation of a photovoltaic system 1 it is ensured during the assembly and startup that the system 1 is built to be fully functional. It is also ensured that the surrounding buildings and trees do not cast a shadow on the solar modules at midday, when the best possible radiation is normally available. Thus at the time of installing the system 1 it is possible to conclude and determine when the best radiation output is available. This can be defined for example in the inverter 5 by entering a time. Usually the best radiation occurs at midday, so that the inverter 5 is preset for measurements in this range. However, if the system is not aligned to the south, but—as is frequently the case—is in an east-west alignment, by inputting a time for example the presetting of the measurements can be transposed.

After the first startup of the system a one-off initializing process is started, in which a measuring process is performed for determining and recording the operating status of the system 1 at preset time points (e.g. at midday) or a defined, set time point, or is performed by manual activation. For this for example the open circuit voltage and the MPP point are determined and saved as reference values. Preferably, the initializing process is only started on a cloudless day, so that there is optimal radiation and thus an optimal operating status can be recorded. Thus after completing the installation an operating assessment is performed in very good—if not always the best possible—conditions, wherein said recorded measurement values are then saved as reference values for additional subsequent measurements.

Once the initializing process is complete the inverter 5 can begin operation. The inverter 5 determines in running feed operation the relevant system parameters and recognizes automatically output-reducing damage in the photovoltaic system 1. In addition, at defined time points or time windows the ratio of MPP voltage to open circuit voltage is formed by the inverter 5. If this ratio worsens continually or abruptly then the solar generator is damaged. A database is created by the inverter 5, in which one or more of the following parameters are detected: Udc [V], inverter output at a time point [W], time and possible date, and preferably the open circuit voltage Uoc [V]. From this data the following module damage can be recognized: high-impedance soldering points in the modules, open soldering point on a cell, hotspots, shadowing, dirt, cell breakage, high-impedance soldering point in the connection box, etc., which can be reported via a display element. The created database can be saved in the inverter 5. With several inverters 5 connected together it is also possible that only one inverter 5 contains this database and the additional inverters 5 transmit the data, in particular measurement data, via WLAN or another network to the inverter 5 with the database to save it there. Of course it is also possible to arrange the database externally.

In order to record data the conditions should be almost always be the same, but there is no need for externally connected sensors, such as for example a radiation sensor. This has the advantage that costs can be reduced and at the same time one source of error can be excluded. The inverter 5 can estimate the weather situation on the basis of recorded data so that only data is determined during permitted weather situations, i.e. on the basis of the recorded data first of all a so-called weather analysis is performed and the data is only saved and used on a successful weather analysis or further data are recorded. The weather analysis is repeated with a negative output at specific intervals which can be predefined, until the weather analysis is classed as positive. Thus data is determined at a later time point. The repetition is performed for example hourly from the beginning of the measurement. With a positive weather analysis the inverter 5 determines the remaining measurements and then does not perform any more new measurements that day. It is of course possible to set the inverter 5 so that the latter performs the measurements several times a day but this is not absolutely necessary.

Preferably, such a weather analysis is performed at a predetermined time point (e.g. midday), whereby the inverter 5 checks whether there is sufficient sun radiation, for which reason the supplied amount of power or the inverter output is determined and compared with a predeterminable value. If this corresponds to a predefinable percentage, for example 50% of the respective maximum value, the inverter 5 decides that the weather analysis was performed positively, i.e. sufficient sun radiation was available. If this percentage is set to be relatively high, only very few or no clouds should be in the sky. The inverter 5 is then set to be very sensitive to the weather analysis.

Once the weather analysis has been performed positively, further measurements are performed by the inverter 5, by means of which the inverter 5 or the control device connected therein or externally can perform an evaluation for recognizing module damage. The individual Udc voltage values are determined by the inverter 5.

The open circuit voltage Uoc is preferably determined in such a way that the inverter 5 remains connected to the grid, but the latter does not take power from the modules for $2_{11} \ldots 2_{mn}$, for a brief period so that it can measure the open circuit voltage Uoc.

Of course, it is also possible to measure the open circuit voltage, such that the inverter 5 is briefly disconnected from the grid or the connected loads are switched off so that there are no longer any loads on the inverter 5.

In order that module damage can be determined it is necessary that a continuous detection of the Udc-voltage is performed for recognizing the module damage. By changing the ratio of MPP voltage to the open circuit voltage of the modules $2_{11} \ldots 2_{mn}$ creeping or sudden module damage can be recognized.

For this the following data are determined and saved:

Udc (start)=average value of detected Udc values over a defined start period,

Uoc (start)=average value of detected Uoc values over a defined start period,

Udc (current)=average value of detected Udc values over a defined current time period, Uoc (current)=average value of detected Uoc values over a defined current time period, Ratio (start)=Udc (start)/Uoc (start)

Ratio (current)=Udc (current)/Uoc (current)

Module damage can be recognized from a deviation of the ratio (current) to the ratio (start). Here the (start) values correspond to the detected measurement values during the initialization process on the installation of the system 1, whereas the (current) values correspond to the currently determined measurement values. Udc (start) or Udc (current) are formed by an average value of 50 (input option) detected day values.

In order to record individual Udc voltages for continuous ratio formation, in an advantageous variant of the invention the following conditions have to be met:

sufficient radiation available (supplied amount of energy or the inverter output between two data logger entries corresponds on average to at least 50% (input option) of the inverter nominal power or the photovoltaic system 1), determining the individual Udc voltage values about midday (input option, assumption: at midday the system should not be affected by shadowing from the assembly site), each day only one value (average value of all Udc voltage values determined on this day) is recorded for calculating Udc (current).

The following, further conditions have to be met in this variant, so that the individually determined Udc voltage value can be used for further calculation:

recording a new individual Udc voltage for determining a Udc daily average value is only performed, if the latter deviates from the Udc (current) by not more than 20% (input option).

on recording a new Udc daily average value for Udc (current) the oldest Udc daily value is dropped. The Udc (current) is always only formed from a number of Udc daily values, as defined above (shift register, FIFO).

Module damage can be recognized if the quotients (as described above) differ from one another, wherein with a corresponding deviation a defect is reported or the last 20 (input option) consecutively individually detected Udc voltage values (i.e. radiation ok, time period ok) lay outside the bandwidth for inclusion in the Udc daily average value and an error message is sent.

Furthermore, it is of course possible that the detected values can also be used for other error messages, i.e. a fault in the system can be established for example if the deviation from predetermined values, in particular the Udc voltage, is too great.

It is possible to say that a method of recognizing module damage or generator damage is performed in a photovoltaic system 1, in which an initializing process is performed for determining the output condition of the system 1 after installation, and for determining measurement values to determine module damage first of all a weather analysis is performed, wherein with a positive weather analysis further measurement values are recorded, but with a negative weather analysis at a later time point a new weather analysis is performed. To recognize module damage a continuous measurement of the Udc voltage is performed, whereby from a change in the ratio of MPP voltage to open circuit voltage of the module $2_{11} \ldots 2_{mn}$ creeping and/or sudden module damage is recognized.

It should be noted at this point that the variants shown only represent a portion of the possible ways of implementing the idea according to the invention. In particular, the implementations of the invention shown in FIG. 6 and FIG. 7 can differ or be combined with one another. A person skilled in the art can easily adapt the predefined information to his requirements.

Finally, as a point of formality, it should be noted that for a better understanding of the structure of the device according to the invention, the latter and its components have only been shown in schematic form in part. Of course, the devices shown may contain additional, not shown component groups or components.

The problem addressed by the independent solutions according to the invention can be taken from the description.

Mainly the individual embodiments shown in FIGS. 6 and 7 can form the subject matter of independent solutions according to the invention. The objectives and solutions according to the invention relating thereto can be taken from the detailed descriptions of these figures.

LIST OF REFERENCE NUMERALS

1 Photovoltaic system
$2_{11} \ldots 2_{mn}$ Solar module
$3_1 \ldots 3_x$ Solar cells
4 Inverter
5 Inverter circuit
6 Analog-digital-converter
7 Central processing unit
8 Memory
9 Signal unit 10 Measuring device
11 Internet
12 Database
13 PC
I Current
$P_1, P_{11} \ldots P_{15}$ Radiated output
t Time
U Voltage
$U_0$ Open circuit voltage
$U_{MPP}$ Voltage
Maximum Power Point

The invention claimed is:

1. A method for recognizing faults in a photovoltaic system, comprising the steps:
    determining a first parameter derived from a first output voltage of the photovoltaic system at a first time point in a first operating state of the photovoltaic-system for determining a starting condition during an initialization process,
    determining a second parameter derived from a second output voltage of the photovoltaic system at a second time point, when a weather analysis for establishing a sun radiation above a threshold leads to a positive result and there is a second operating state comparable with the first operating state, wherein the weather analysis is performed by using output data from the inverter and without using a light sensitive sensor or a radiation sensor, and wherein the weather analysis is considered to be positive if a power output of the inverter is above 15% of the respective nominal power,
    determining a deviation between the first and second parameter and
    outputting an error message when the deviation exceeds a predeterminable threshold,
    wherein each of the first parameter and the second parameter is the ratio between the maximum power point voltage and the open circuit voltage of the photovoltaic system.

2. The method as claimed in claim 1, wherein the first parameter and the second parameter are determined at a radiation greater than 100 W/m².

3. The method as claimed in claim 1, wherein the first parameter and the second parameter are determined at essentially the same radiation or the same power output.

4. The method as claimed in claim 1, wherein the first parameter and the second parameter are determined at essentially the same temperature.

5. The method as claimed in claim 1, wherein to determine the operating status of the photovoltaic system meteorological data is used from at least one of a weather station and a database.

6. The method as claimed in claim 1, wherein the first parameter and the second parameter are determined on different days at essentially the same time.

7. The method as claimed in claim 1, wherein the first parameter and the second parameter are determined on different days essentially at the same position of the sun.

8. The method as claimed in claim 1, wherein the first parameter and the second parameter are determined at essentially the same output power of the photovoltaic system.

9. A device for recognizing faults in a photovoltaic system, comprising:
    a determining device determining a first parameter derived from a first output voltage of the photovoltaic system at a first time point in a first operating state of the photovoltaic system and determining a second parameter derived from a second output voltage of the photovoltaic system at a second time point in a second operating state comparable with the first operating state when a weather analysis for establishing a sun radiation above a threshold leads to a positive result, wherein the weather analysis is performed by using output data from the inverter and without using a light sensitive sensor or a radiation sensor, and wherein the weather analysis is considered to be positive if a power output of the inverter is above 15% of the respective nominal power,
    a deviation determining device determining a deviation between the first and second parameter and
    an error message indicator issuing an error message when the deviation exceeds a predeterminable threshold,
    wherein each of the first parameter and the second parameter is the ratio between the maximum power point voltage and the open circuit voltage of the photovoltaic system.

10. An inverter for a photovoltaic system with DC voltage side and AC voltage side connections, wherein the inverter comprises the device for recognizing faults in a photovoltaic system as claimed in claim 9 wherein the device for recognizing faults in a photovoltaic system is connected to the DC voltage side connections.

11. A charging controller for a photovoltaic system, wherein the charging controller comprises the device for recognizing faults in a photovoltaic system according to claim 9 wherein the device for recognizing faults in a photovoltaic system is connected to input-side connections of the charging controller.

12. A photovoltaic system comprising one or more solar cells and/or one or more solar modules, wherein the photovoltaic system further comprises an inverter with DC voltage side connections connected to the device for recognizing faults in a photovoltaic system according to claim 9 and at least one of AC voltage side connections and a charging controller having input-side connections connected to said device.

13. A computer program product with a non-transitory computer program saved thereon, which can be loaded into the memory of the device for recognizing faults in a photovoltaic system according to claim 9 and/or an inverter with DC voltage side connections connected to said device and AC voltage side connections and/or a charging controller having input-side connections connected to said device and/or a computer, and executes a method for recognizing faults in a photovoltaic system when the computer program is implemented there, said method comprising the steps:
    determining a first parameter derived from a first output voltage of the photovoltaic system at a first time point in a first operating state of the photovoltaic system for determining a starting condition during an initialization process,
    determining a second parameter derived from a second output voltage of the photovoltaic system at a second time point, when a weather analysis for establishing a sun radiation above a threshold leads to a positive result and there is a second operating state comparable with the first operating state, wherein the weather analysis is performed by using output data from the inverter and without using a light sensitive sensor or a radiation sensor, and wherein the weather analysis is considered to be positive if a power output of the inverter is above 15% of the respective nominal power,
    determining a deviation between the first and second parameter and outputting an error message when the deviation exceeds a predeterminable threshold,
wherein each of the first parameter and the second parameter is the ratio between the maximum power point voltage and the open circuit voltage of the photovoltaic system.

14. A method for recognizing module damage in a photovoltaic system, wherein an initialization process is performed for determining a starting condition of the system after installation, and wherein for determining measurement values for recognizing module damage with determined measurement values a weather analysis for detecting a solar radiation which is above a threshold is conducted, wherein with a positive weather analysis additional measurement values are recorded and compared with the starting condition, wherein the weather analysis is performed by using output data from the inverter and without using a light sensitive sensor or a radiation sensor, wherein the weather analysis is considered to be positive if a power output of the inverter is above 15% of the respective nominal power, and wherein the measurement values are of the ratio between the maximum power point voltage and the open circuit voltage of the photovoltaic system.

15. The method as claimed in claim 14, wherein with a negative weather analysis a new weather analysis is carried out at least at a later time point.

16. The method as claimed in claim 14, wherein to identify module damage a continuous assessment of the Udc voltage is performed, wherein from a change in the ratio of Mpp voltage to the open circuit voltage of the module a creeping and/or sudden instance of module damage is identified.

17. The method as claimed in claim 14, wherein the initializing process is started at predetermined time points, in particular at midday, or at a defined, set time point, or a manually activated measuring process is started for determining and recording the operating status of the system.

18. The method as claimed in claim 14, wherein at least one instance of module damage is identified and reported via a display element, wherein the at least one instance of module damage is selected from the group consisting of: high-impedance soldering points inside the modules, open soldering point on a cell, hotspots, shadowing, dirt, cell breakage, and high-impedance soldering point in the connection box.

19. The method as claimed in claim 14, wherein at a predetermined time point, a weather analysis is carried out, in which the supplied amount of energy or the inverter power is identified and compared with a predeterminable value to achieve a positive weather analysis.

20. The method as claimed in claim 14, wherein an evaluation for recognizing module damage is performed via a control device arranged in the inverter or an externally connected control device.

* * * * *